United States Patent
Croft

(10) Patent No.: US 8,222,090 B2
(45) Date of Patent: Jul. 17, 2012

(54) MODULAR DIE AND MASK FOR SEMICONDUCTOR PROCESSING

(75) Inventor: Scott Croft, Salt Lake City, UT (US)

(73) Assignee: Fairchild Semiconductor Corporation, San Jose, CA (US)

( * ) Notice: Subject to any disclaimer, the term of this patent is extended or adjusted under 35 U.S.C. 154(b) by 509 days.

(21) Appl. No.: 12/535,093

(22) Filed: Aug. 4, 2009

(65) Prior Publication Data

US 2011/0033981 A1 Feb. 10, 2011

(51) Int. Cl.
*H01L 21/82* (2006.01)
(52) U.S. Cl. .......... 438/129; 257/E21.506; 257/E21.507
(58) Field of Classification Search .................. 438/129
See application file for complete search history.

(56) References Cited

U.S. PATENT DOCUMENTS

| | | | | |
|---|---|---|---|---|
| 3,615,466 A | * | 10/1971 | Sahni | 430/312 |
| 3,795,975 A | * | 3/1974 | Calhoun et al. | 438/6 |
| 4,309,811 A | * | 1/1982 | Calhoun | 438/6 |
| 5,340,767 A | * | 8/1994 | Flaherty | 438/128 |
| 5,801,406 A | * | 9/1998 | Lubow et al. | 257/202 |
| 6,292,024 B1 | * | 9/2001 | Jensen et al. | 326/47 |
| 6,710,414 B2 | * | 3/2004 | Blanchard | 257/390 |
| 6,780,745 B2 | * | 8/2004 | Shoji et al. | 438/598 |
| 6,844,218 B2 | | 1/2005 | Potts | |
| 7,337,425 B2 | | 2/2008 | Kirk | |
| 8,004,869 B2 | * | 8/2011 | Gruber et al. | 365/51 |
| 2002/0146865 A1 | * | 10/2002 | Hoel | 438/130 |
| 2004/0140483 A1 | * | 7/2004 | Yonemaru | 257/204 |

* cited by examiner

*Primary Examiner* — David Zarneke
(74) *Attorney, Agent, or Firm* — Kirton McConkie; Kenneth E. Horton

(57) ABSTRACT

Modular dies and modular masks that can be used during the manufacture of semiconductor devices are described. The modular mask can be used repeatedly to make multiple, substantially-similar modular dies. The modular die contains a substrate with an integrated circuit as well as a conductive layer containing a source metal and a gate metal connected respectively to the source and gate of the integrated circuit. The gate metal of the conductive layer is located only in an outer portion of the modular die. The modular die can be made by providing the integrated circuit in a first and second portion of the substrate, providing the conductive layer on both the first and second portions, making a first modular die by patterning the conductive layer on the first portion using the modular mask; moving the modular mask to the second portion and using it to make a second modular die by patterning the conductive layer on the second portion. Thus, fewer mask sets need to be made, improving efficiency and reducing costs. Other embodiments are described.

26 Claims, 6 Drawing Sheets

140　　145

MODULAR DIE AND MASK FOR SEMICONDUCTOR PROCESSING

FIELD

This application relates generally to semiconductor devices and methods for making such devices. More specifically, this application describes modular dies and modular masks that can be used during the manufacture of semiconductor devices.

BACKGROUND

Integrated circuit (IC) devices are used in a wide variety of electronic apparatus. IC devices comprise a miniaturized electronic circuit that has been manufactured in the surface of a substrate of semiconductor material. The circuits are composed of many overlapping layers that can be formed by photolithography. Some layers contain dopants that can be diffused into the substrate (called diffusion layers) or ions that are implanted (implant layers) into the substrate. Other layers are conductors (polysilicon or metal layers) or connections between the conducting layers (via or contact layers).

IC devices can be fabricated in a layer-by-layer process that uses a combination of steps, including imaging, deposition, etching, doping and cleaning. Silicon wafers are typically used as the substrate and photolithography is used to mark different areas of the substrate to be doped or to deposit and define polysilicon, insulators, or metal layers. A mask set defines the geometry for the photolithography that is used during fabrication. Each mask set typically contains as many as twenty or more masks, each of which defines a specific photolithographic step in the fabrication process. When the semiconductor devices are an ASIC (application specific integrated circuit) device or a discrete device, a separate mask set is typically created for each process in making that specific product.

SUMMARY

This application relates to modular dies and modular masks that can be used during the manufacture of semiconductor devices. The modular mask can be used repeatedly to make multiple, substantially-similar modular dies. The modular die contains a substrate with an integrated circuit as well as a conductive layer containing a source metal and a gate metal connected respectively to the source and gate of the integrated circuit. The gate metal of the conductive layer is located only in an outer portion of the modular die. The modular die can be made by providing the integrated circuit in a first and second portion of the substrate, providing the conductive layer on both the first and second portions, making a first modular die by patterning the conductive layer on the first portion using the modular mask; moving the modular mask to the second portion and using it to make a second modular die by patterning the conductive layer on the second portion. Thus, fewer mask sets need to be made, improving efficiency and reducing costs.

BRIEF DESCRIPTION OF THE DRAWINGS

The following description can be better understood in light of the Figures, in which.

Figure 1:
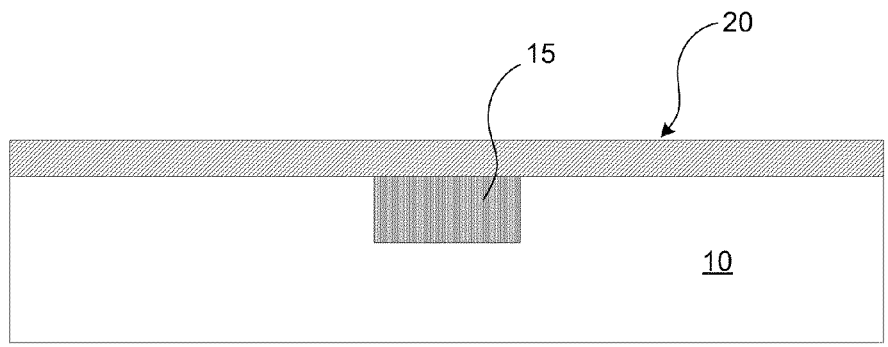
FIG. 1 shows some embodiments of a substrate containing an integrated circuit with a first conductive layer thereon.
Figure 2:
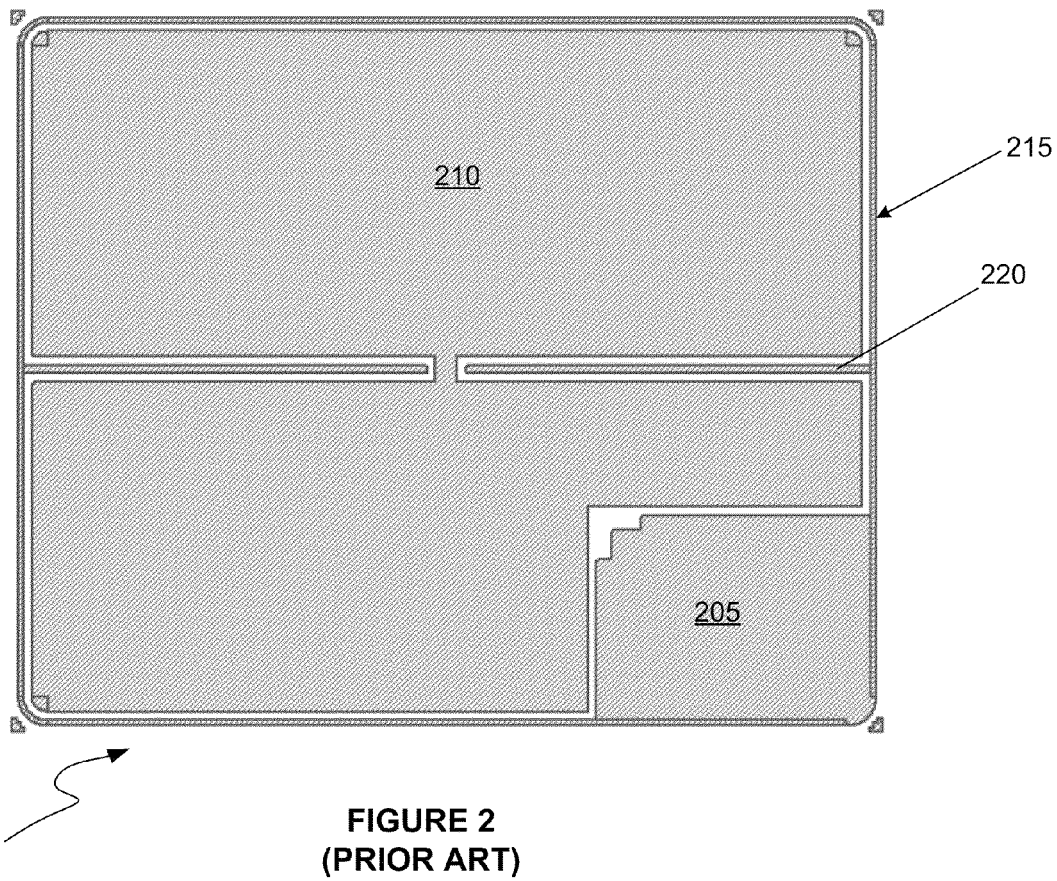
FIG. 2 depicts the configuration of a conventional gate metal and source metal formed over a substrate containing an integrated circuit.

The Figures illustrate specific aspects of the semiconductor devices and methods for making such devices. Together with the following description, the Figures demonstrate and explain the principles of the methods and structures produced through these methods. In the drawings, the thickness of layers and regions are exaggerated for clarity. It will also be understood that when a layer, component, or substrate is referred to as being "on" another layer, component, or substrate, it can be directly on the other layer, component, or substrate, or intervening layers may also be present. The same reference numerals in different drawings represent the same element, and thus their descriptions will not be repeated.

DETAILED DESCRIPTION

The following description supplies specific details in order to provide a thorough understanding. Nevertheless, the skilled artisan would understand that the devices and associated methods of making and using the devices can be implemented and used without employing these specific details. Indeed, the devices and associated methods can be placed into practice by modifying the illustrated devices and associated methods and can be used in conjunction with any other apparatus and techniques conventionally used in the industry. For example, while the description below focuses on methods for making for semiconductor devices in the IC industry, it could be used in and applied to other electronic devices like optoelectronic devices, solar cells, MEMS structures, lighting controls, power supplies, and amplifiers.

Some embodiments of the semiconductor devices and methods for making such devices are shown in FIGS. 1-11. In these embodiments, the methods for making the semiconductor devices begin by providing a substrate 10, as shown in FIG. 1. The substrate 10 may be made of any suitable semiconductor material. Some non-limiting examples of such materials may include silicon, gallium arsenide, silicon carbide, gallium nitride, silicon and germanium, and combinations thereof.

Next, as known in the art, any known integrated circuit (IC) 15 can be formed in or on the substrate 10 using any known processing. Some non-limiting examples of these IC devices may include logic or digital IC devices, linear regulators, audio power amplifiers, LDO, driver IC, diodes, and/or transistors, including zener diodes, schottky diodes, small signal diodes, bipolar junction transistors ("BJT"), metal-oxide-semiconductor field-effect transistors ("MOSFET"), insulated-gate-bipolar transistors ("IGBT"), and insulated-gate field-effect transistors ("IGFET").

Once the IC device 15 is formed in the substrate 10, a first conductive layer 20 is then formed over the IC device 15 and the substrate 10 as shown in FIG. 1. The first conductive layer 20 is formed as part of a modular die and therefore can have a modular configuration. A modular die can be used by itself to form a complete device or the modular die can be combined with another substantially similar modular die (or with other substantially similar modular dies) to form a completed device, as described herein. Since the modular dies that are used can all be substantially similar, the mask used to form the modular die (the modular mask) can be used and re-used time and time again regardless of the final device manufactured. For example, the modular mask could be used to form a first modular die from a first wafer. The modular mask could then be used again to form a substantially similar second (or third, fourth, etc.) modular die from the same first wafer.

In some embodiments, the modular mask can be combined with another mask to form a combination modular mask. The combination modular mask can contain two substantially similar modular masks to manufacture a completed semiconductor device that contains two modular dies. The combination modular mask can also contain three (or four, five, etc.) substantially similar modular masks to manufacture a completed semiconductor device that contains three (or four, five, etc.) modular dies.

In some embodiments, the modular mask (or combination modular mask) could then be used with a second (or third, fourth, etc.) wafer. With this second wafer, the modular mask could be used for forming any number of modular dies. As well, the combined modular mask could be used to form any desired combination of modular dies in the second wafer.

Figure 3:
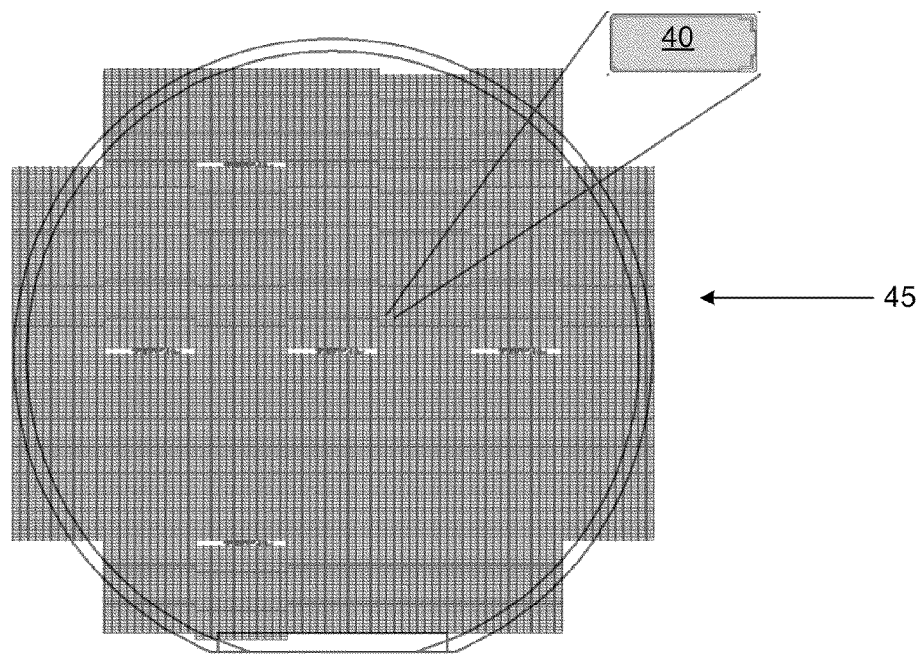
FIG. 3 shows some embodiments of a wafer containing a modular die.

In the embodiments shown in FIG. 3, the modular mask described is used to form a modular die 40 on the wafer 45. The modular die 45 contains a substrate 10 with the IC device 15 and the first conductive layer 20 formed thereon, as shown in FIG. 1. The first conductive layer 20 can comprise any conductive material known in the art, including Al, Cu, Si, TiW, or combinations thereof. The first conductive layer 20 can be formed by patterning a conductive layer of the desired material using the modular mask (or the combined modular mask) during photolithography.

The first conductive layer 20 can be configured to contain both a gate metal 50 in an outer portion of the modular die and a source metal 55 in an inner portion of the modular die. The gate metal 50 is configured to be connected to the gate of the integrated circuit and the source metal 55 is configured to be connected to the source of the integrated circuit. The conventional device 200 depicted in FIG. 2, on the other hand, contains both a source metal 210 and a gate metal which contains an outer portion 215 around the edge of the device, a dividing portion 220 that partially divides the source metal 210, and an intruding portion 205 that intrudes into the interior of the device. But with the modular dies described herein, the gate metal 50 is only contained in an outer portion of the die and does not contain a dividing portion or an intruding portion. This allows the source metal 55 of the modular die to be used in this intruding portion instead of the gate metal. In some embodiments, the area used for the source metal can be increased by 1% to about 20% depending on the die and gate pad size with the conventional device layouts.

Figure 4:
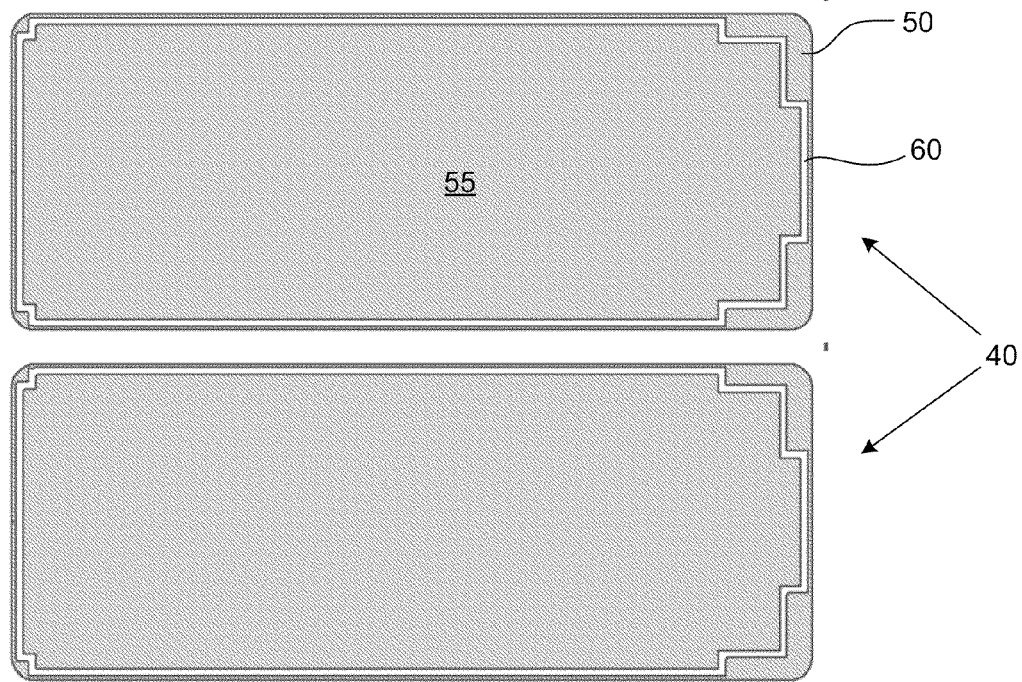
FIG. 4 shows some embodiments of modular dies containing a first conductive layer having a gate metal and a source metal.
Figure 5:
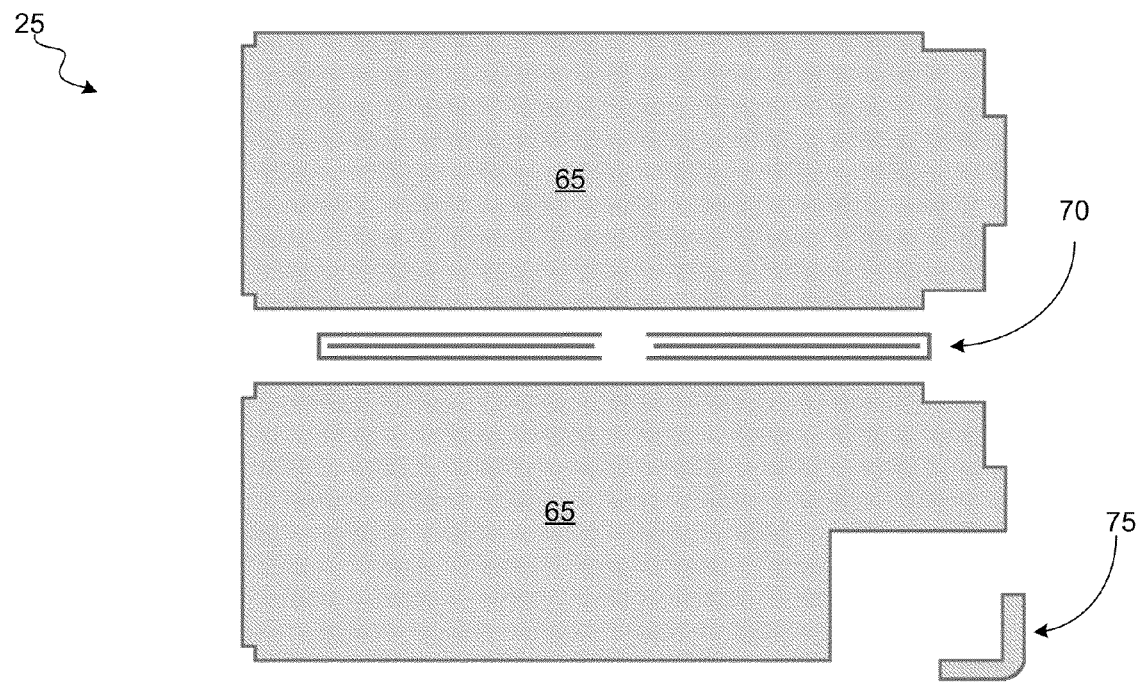
FIG. 5 depicts some embodiments of an optional contact layer that can be formed on the first conductive layer.

In the embodiments depicted in FIG. 4, the gate metal 50 and the source metal 55 are separated from each other by an insulating region 60. The insulating region 60 can be the substrate 10 itself or an insulating layer such as silicon oxide or silicon nitride. The insulating region 60 can be formed by any process known in the art, including during the patterning process.

Next, an optional contact layer 25 can be formed over the first conductive layer 20. The contact layer 25 connects the first conductive layer 30 to a second conductive layer 30 when it is used. The contact layer 25 can comprise any conductive material known in the art, including Al, Cu, Si, TiW, or combinations thereof. The contact layer 25 can be formed using any process known in the art, including by patterning the conductive material for this layer using a contact mask during photolithography. The pattern of the contact layer 25 and the corresponding pattern of the contact mask are selected with the completed semiconductor device in mind.

Accordingly, in some embodiments, the contact layer 25 is configured to contain both a source contact 65 and a gate contact 75. The source contact 65 will be used to connect the source metal 55 to the source pad of the second conductive layer (described below). And the gate contact 75 will be used to connect the gate metal 50 to the gate pad of the second conductive layer (described below). In the embodiments where more than one modular die will be combined, contact layer can also contain zener and/or schottky diodes 70 that will be used with the second conductive layer to form a source connection, zener diodes for ESD protection, or SyncFet region schottky diodes for improved switching efficiency. These diodes can be built in the scribe line areas and be connected and used if needed. The scribe line diodes not used or needed can be cut out during the assembly process.

When the contact layer 25 is used in the device, a second conductive layer 30 can be formed over the contact layer 25. The second conductive layer 30 can comprise any conductive material known in the art, including Al, Cu, Si, TiW, or combinations thereof. The second conductive layer can be formed using any process known in the art, including by patterning a conductive film using a pad mask during photolithography. The pattern of the second conductive layer 30 and the corresponding pattern of the pad mask are selected with the completed semiconductor device in mind.

Figure 6:
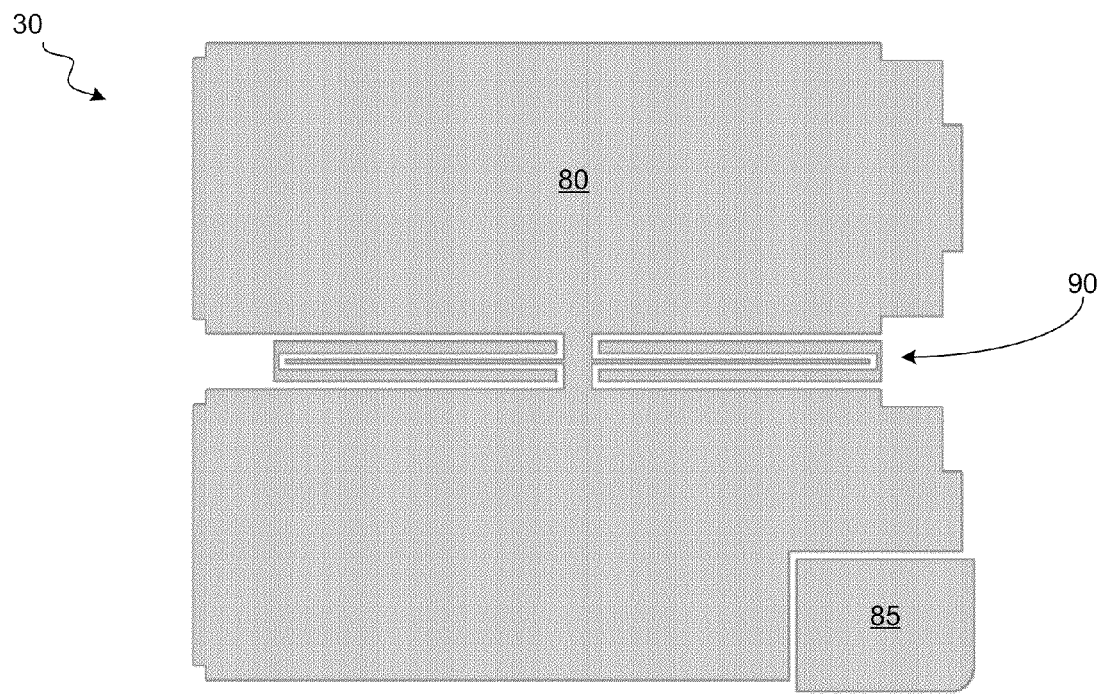
FIG. 6 shows some embodiments of an optional second conductive layer that can be formed on the contact layer.
Figure 7:
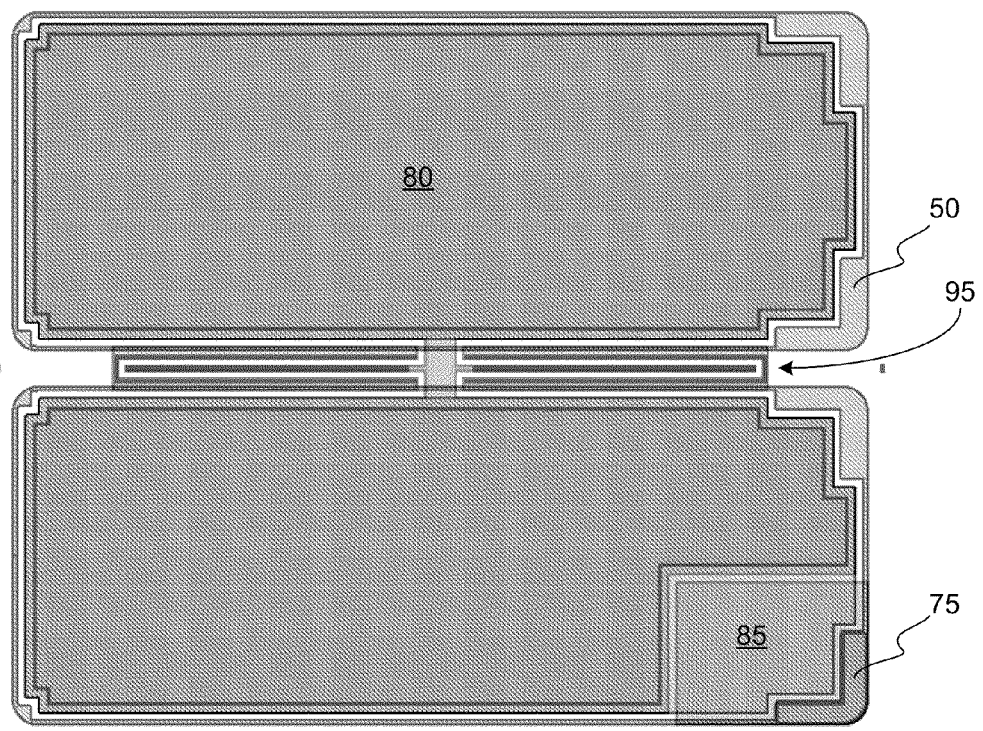
FIG. 7 shows some embodiments of a modular die with the first and second conductive layers connected by the contact layer.

In the embodiments shown in FIG. 6, the second conductive layer 30 can be configured to contain both a gate pad 85 in a corner portion and a source pad 80. In the embodiments where more than one modular die will be combined in a device, the second conducive layer can also contain zener or schottky diodes 90 that can be used to form the source connection, zener diodes for ESD protection, or SyncFet region schottky diodes for improved switching efficiency. These diodes can be built in the scribe line areas and be connected and used if needed. The scribe line diodes not used or needed can be cut out during the assembly process. After the second conductive layer 30 has been formed, the resulting structure is depicted in FIG. 7. In these embodiments, the structure contains a region 95 that contains the source connection and a zener diode (or schottky diode SyncFet area) that has been formed.

Figure 8:
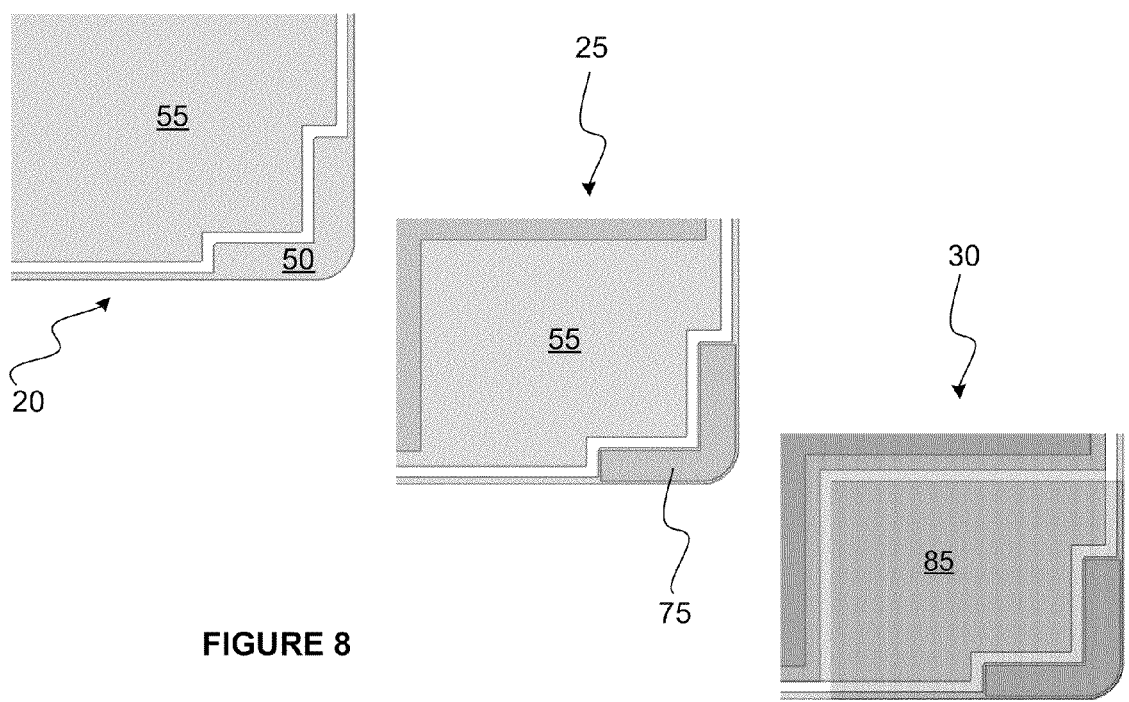
FIG. 8 depicts some embodiments of the gate connection between the first and second conductive layers.

The gate connection for these embodiments is shown in detail in FIG. 8. The source metal 55 in the first conductive layer 20 is connected to the source pad 80 in the second conductive layer by the source contact 65 in the contact layer 25. The gate metal 50 in the first conductive layer 20 is connected to the gate pad 85 in the second conductive layer 30 by the gate contact 75 in the contact layer 25. With such a configuration, the semiconductor device contains an active area under the gate pad 85 which did not exist in the conventional devices depicted in FIG. 2. In some embodiments, the active area of the current devices relative to these conventional devices has been maintained substantially the same, yet the area of the gate pad has been increased by about 1 to about 99% by the use of such a configuration. In other embodiments, the area of the gate pad has been increased by about 1 to about 20% by the use of such a configuration.

Figure 9:
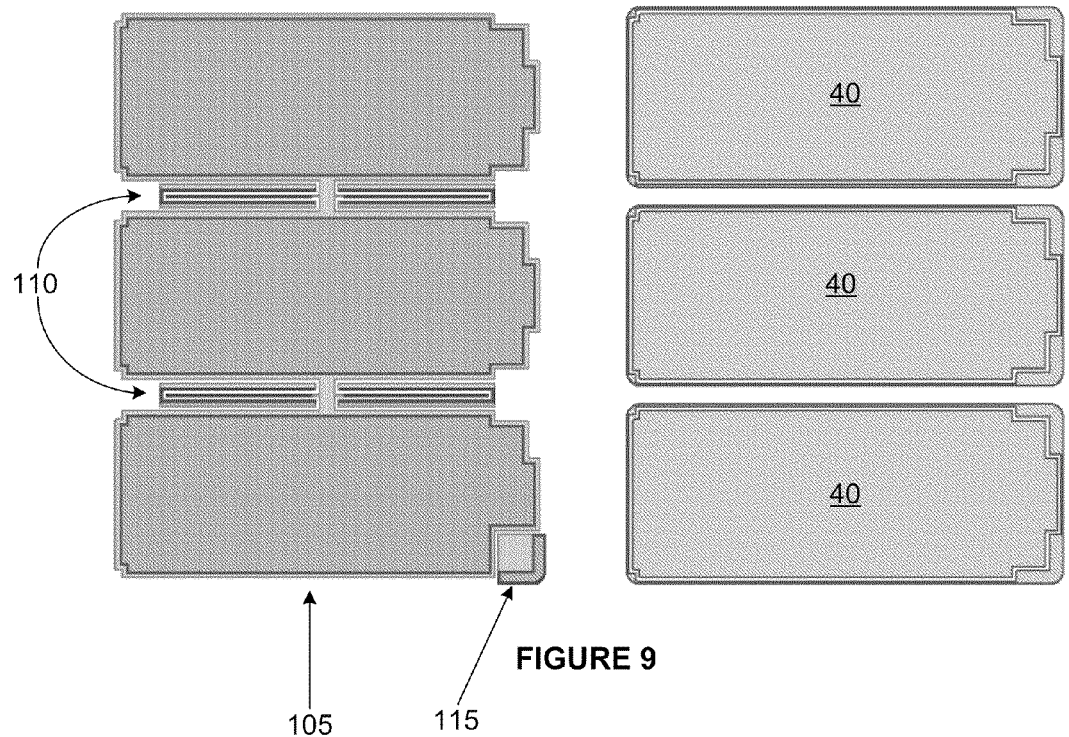
FIGS. 9-11 show other embodiments of modular dies with the first and second conductive layers connected by a contact layer.

The first conductive layer 20 (and the substrate 10 underlying it) has a modular design and so its configuration (and the configuration of the modular mask) will be substantially similar from one discrete or ASIC device to the next. The contact layer 25 and the second conductive layer 30, on the other hand, will vary from one ASIC or discrete device to the next. Accordingly, the configuration of the contact layer 25 and the second conductive layer 30 (and the contact mask and pad mask) will change from one device design to the next. For example, in some embodiments the contact layer 25 and the second conductive layer 30 (collectively, 105) can be configured as shown in FIG. 9. When these layers are provided on the substantially similar 3 modular dies 40 shown in FIG. 9, an ESD protected device is formed with a Zener diode 110 and a gate 115.

Figure 10:
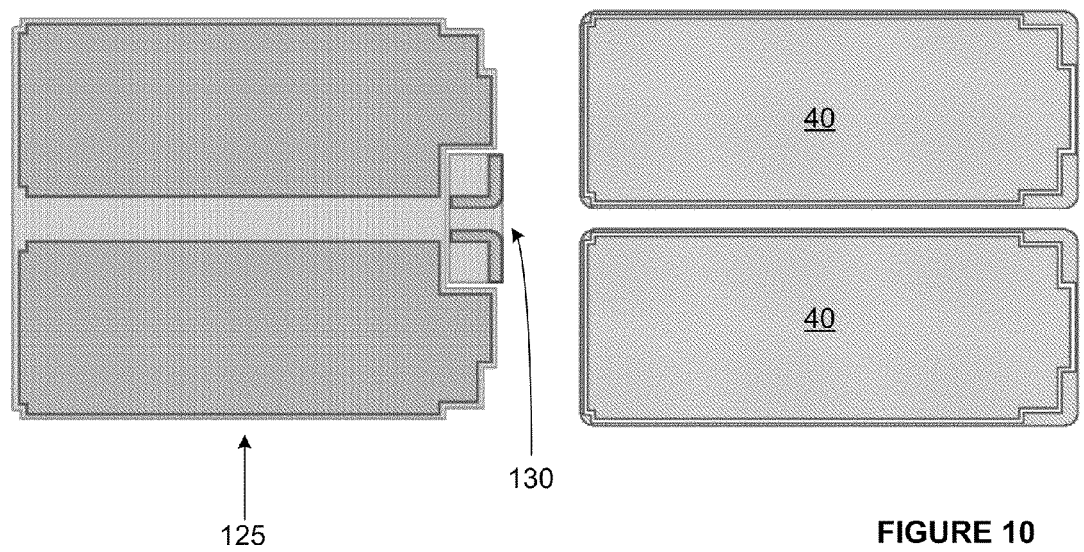
Figure 11:
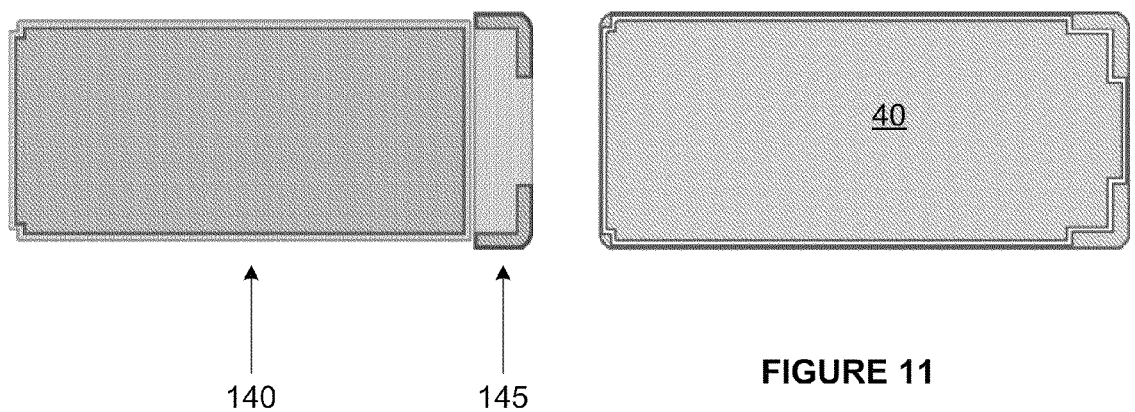

As another example, in other embodiments the contact layer 25 and the second conductive layer 30 (collectively, 125) can be configured as shown in FIG. 10. When these layers are provided on the substantially similar 2 modular dies 40 shown in FIG. 10, a MOSFET device is formed that does not contain a Zener diode, but rather contains a centered gate structure 130. As yet another example, in yet other embodiments the contact layer 25 and the second conductive layer 30 (collectively, 140) can be configured as shown in FIG. 11. When these layers are provided on the modular die 40 shown in FIG. 11, a MOSFET device is formed that does not contain a Zener diode, but does contain a dual gate structure 145.

A drain can be formed on the backside of the modular die 40 using any known process. In some embodiments the drain can be formed by any known back side metal contact so that is connected to the drain of the integrated circuit in the substrate 10.

After the formation of the drain and/or the second conductive layer 30, subsequent processing for the final semiconductor device can be performed as known in the art. For example, the die containing the gate pad, source pad, and drain can be attached to any known interconnect structure, such as a lead frame. The resulting structure can then be encapsulated in any known molding material to make a semiconductor package, such as an epoxy molding compound, a thermoset resin, a thermoplastic material, or a potting material. The package can then be singulated using any process known in the art, including a saw singulation process or a water jet singulation process, or a laser-cut singulation method. Then, the singulated semiconductor packages may be electrically tested, taped, and reeled using any processes known in the art. The semiconductor packages can then be connected to a printed circuit board using any known connection (i.e., solder connectors) and used in any electronic device known in the art such as portable computers, disk drives, USB controllers, portable audio devices, or any other portable electronic devices.

The methods and semiconductor devices described above have several features. First, since the modular mask (and combination modular mask) can be re-used, the process reduces the costs for masks by about 10 to about 25% and, in some instances by about one-third. Second, since the modular dies contain a first conductive layer that is substantially the same regarding of the final semiconductor device formed, the processing can be completed up until the first conductive layer is formed regardless of the desired ASIC or discrete device. This improves the cycle time needed for making new semiconductor devices by about 20 to about 40%. Third, the area of the gate pad has been increased by without any loss of the active area. Fourth, multiple die sizes can be created since the modular die can be combined with other modular die(s) to create any desired die size. Fifth, the zener diode and the SyncFet components of the devices could be placed in the scribe areas, which allows for a smaller die foot print and die flexibility.

In some embodiments, the semiconductor device can be made by the method comprising: providing a first integrated circuit in a first portion of a substrate and a second integrated circuit in a second portion of the substrate; providing a conductive layer on both the first portion and the second portion of the substrate; making a first modular die by patterning the conductive layer on the first portion using a modular mask; moving the modular mask to the second portion of the substrate; and making a second modular die by patterning the conductive layer on the second substrate portion using the same modular mask.

In other embodiments, a re-usable modular mask can be used for making multiple, substantially similar modular dies, the mask capable of patterning a conductive layer to contain both a source metal and a gate metal that located only in an outer portion of the modular die, the source metal being connected to the source and the gate metal being connected to the gate; wherein the gate metal covers about 1 to about 99% of the die.

In yet other embodiments, a modular die can comprise: a substrate containing an integrated circuit having a source and a gate; and a conductive layer located on the substrate, the conductive layer containing both a source metal and a gate metal that located only in an outer portion of the modular die, the source metal being connected to the source and the gate metal being connected to the gate; wherein the gate metal covers about 1 to about 99% of the die.

In still other embodiments, a semiconductor device can contain a modular die comprising: a substrate containing an integrated circuit having a source and a gate; and a conductive layer located on the substrate, the conductive layer containing both a source metal and a gate metal that located only in an outer portion of the modular die, the source metal being connected to the source and the gate metal being connected to the gate; wherein the gate metal covers about 1 to about 99% of the die.

In even other embodiments, an electronic device can contain a semiconductor device having a modular die, comprising: a substrate containing an integrated circuit having a source and a gate; and a conductive layer located on the substrate, the conductive layer containing both a source metal and a gate metal that located only in an outer portion of the modular die, the source metal being connected to the source and the gate metal being connected to the gate; wherein the gate metal covers only about 1 to about 99% of the die.

In addition to any previously indicated modification, numerous other variations and alternative arrangements may be devised by those skilled in the art without departing from the spirit and scope of this description, and appended claims are intended to cover such modifications and arrangements. Thus, while the information has been described above with particularity and detail in connection with what is presently deemed to be the most practical and preferred aspects, it will be apparent to those of ordinary skill in the art that numerous modifications, including, but not limited to, form, function, manner of operation and use may be made without departing from the principles and concepts set forth herein. Also, as used herein, examples are meant to be illustrative only and should not be construed to be limiting in any manner.

The invention claimed is:

1. A method for making a semiconductor device, comprising:
providing a first integrated circuit in a first portion of a substrate and a second integrated circuit in a second portion of the substrate;
providing a conductive layer on both the first portion and the second portion of the substrate;
making a first modular die by patterning the conductive layer on the first portion using a modular mask;
moving the modular mask to the second portion of the substrate; and
making a second modular die by patterning the conductive layer on the second substrate portion using the same modular mask.

2. The method of claim 1, wherein the conductive layer comprises a source metal and also a gate metal that is located only in an outer portion of the first or second modular die.

3. The method of claim 2, further comprising providing a source contact and a gate contact on the source metal and the gate metal and then providing a source pad and a gate pad on the source contact and the gate contact.

4. The method of claim 3, wherein the semiconductor device contains an active area under the gate pad.

5. The method of claim 4, wherein the active area under the gate pad ranges from about 1 to about 99% of the area of the die.

6. The method of claim 1, wherein the first modular die can be used alone to form a first die layout.

7. The method of claim 1, wherein the first modular die can be used with the second modular die to form a second die layout.

8. The method of claim 1, further comprising:
providing a third integrated circuit in a second substrate;
providing a second conductive layer on the third integrated circuit, wherein the second conductive layer can be the same or different than the first conductive layer;
moving the modular mask to the second substrate; and
making a third modular die by patterning the second conductive layer on the third integrated circuit by using that modular mask.

9. The method of claim 8, wherein the second conductive layer comprises a source metal and also a gate metal that is located only in an outer portion of the third modular die.

10. The method of claim 8, wherein a substantially similar third modular die can be used with the first and second modular dies to form a third die layout different.

11. A method for making a semiconductor device, comprising:
providing a first integrated circuit in a first portion of a substrate and a second integrated circuit in a second portion of the substrate;
providing a conductive layer on both the first portion and the second portion of the substrate;
making a first modular die by patterning the conductive layer on the first portion using a modular mask to form a source metal and also a gate metal that is located only in an outer portion of the first modular die;
moving the modular mask to the second portion of the substrate; and
making a second modular die by patterning the conductive layer on the second substrate portion using the same modular mask to form a source metal and also a gate metal that is located only in an outer portion of the second modular die.

12. The method of claim 11, wherein the gate metal covers about 1 to about 99% of the die.

13. The method of claim 11, further comprising providing a source contact and a gate contact on the source metal and the gate metal and then providing a source pad and a gate pad on the source contact and the gate contact.

14. The method of claim 13, wherein the semiconductor device contains an active area under the gate pad that ranges from about 1 to about 20% of the area of the die.

15. The method of claim 11, wherein the first modular die can be used alone to form a first die layout.

16. The method of claim 11, wherein the first modular die can be used with the second modular die to form a second die layout.

17. The method of claim 11, further comprising:
providing a third integrated circuit in a second substrate;
providing a second conductive layer on the third integrated circuit, wherein the second conductive layer can be the same or different than the first conductive layer;
moving the modular mask to the second substrate; and
making a third modular die by patterning the second conductive layer on the third integrated circuit by using that modular mask.

18. The method of claim 17, wherein the second conductive layer comprises a source metal and also a gate metal that is located only in an outer portion of the third modular die.

19. The method of claim 17, wherein a substantially similar third modular die can be used with the first and second modular dies to form a third die layout different.

20. A method for making an electronic apparatus containing a semiconductor device, comprising:
making a semiconductor device by:
providing a first integrated circuit in a first portion of a substrate and a second integrated circuit in a second portion of the substrate;
providing a conductive layer on both the first portion and the second portion of the substrate;
making a first modular die by patterning the conductive layer on the first portion using a modular mask;
moving the modular mask to the second portion of the substrate; and
making a second modular die by patterning the conductive layer on the second substrate portion using the same modular mask;
packaging the semiconductor device;
singulating the semiconductor package; and
connecting the singulated semiconductor package to a circuit board.

21. The method of claim 20, wherein the conductive layer comprises a source metal and also a gate metal that is located only in an outer portion of the first or second modular die.

22. The method of claim 20, wherein the first modular die can be used alone to form a first die layout.

23. The method of claim 20, wherein the first modular die can be used with the second modular die to form a second die layout.

24. The method of claim 20, further comprising:
providing a third integrated circuit in a second substrate;
providing a second conductive layer on the third integrated circuit, wherein the second conductive layer can be the same or different than the first conductive layer;
moving the modular mask to the second substrate; and
making a third modular die by patterning the second conductive layer on the third integrated circuit by using that modular mask.

25. The method of claim 24, wherein the second conductive layer comprises a source metal and also a gate metal that is located only in an outer portion of the third modular die.

26. The method of claim 24, wherein a substantially similar third modular die can be used with the first and second modular dies to form a third die layout different.

* * * * *